(12) United States Patent
Ruckerbauer et al.

(10) Patent No.: US 6,972,981 B2
(45) Date of Patent: Dec. 6, 2005

(54) SEMICONDUCTOR MEMORY MODULE

(75) Inventors: Hermann Ruckerbauer, Moos (DE);
Maksim Kuzmenka, München (DE);
Andreas Jakobs, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/909,205

(22) Filed: Jul. 30, 2004

(65) Prior Publication Data

US 2005/0078532 A1    Apr. 14, 2005

(30) Foreign Application Priority Data

Jul. 30, 2003    (DE) ................. 103 34 779

(51) Int. Cl.[7] ............................... G11C 5/06

(52) U.S. Cl. .............. 365/63; 365/51; 365/52

(58) Field of Search ............... 365/51, 63, 52

(56) References Cited

U.S. PATENT DOCUMENTS

| | | | |
|---|---|---|---|
| 6,477,614 B1 | 11/2002 | Leddige et al. | |
| 6,480,948 B1 | 11/2002 | Virajpet et al. | |
| 6,654,270 B2 * | 11/2003 | Osaka et al. | ............ 365/51 |
| 2002/0129215 A1 | 9/2002 | Yoo et al. | |

* cited by examiner

*Primary Examiner*—Son T. Dinh
(74) *Attorney, Agent, or Firm*—Dicke, Billig & Czaja, PLLC

(57) ABSTRACT

The invention relates to a semiconductor memory module having a plurality of memory chips and at least one buffer chip, which drives clock signals and command and address signals to the memory chips and also drives data signals to, and receives them from, the memory chips via a module-internal clock, address, command and data signal bus. The buffer chip forms an interface to an external memory main bus and the memory chips are arranged in at least one row. The memory chips have separate writing and reading clock signal inputs for receiving the clock signals and the clock signal lines are routed in at least one loop, via the memory chips, from the buffer chip to the end of each row and from there back to the buffer chip

20 Claims, 4 Drawing Sheets

SEMICONDUCTOR MEMORY MODULE

CROSS-REFERENCE TO RELATED APPLICATIONS

This Utility Patent Application claims priority to German Patent Application No. DE 103 34 779.8, filed on Jul. 30, 2003, which is incorporated herein by reference.

BACKGROUND

The invention relates to a semiconductor memory module having a plurality of memory chips and at least one buffer chip, which drives clock signals and command and address signals to the memory chips and also drives data signals to, and receives them from, the memory chips via a module-internal clock, address, command and data signal bus. The buffer chip forms an interface to an external memory main bus and the memory chips are arranged in at least one row, starting from the buffer chip, and are connected to the latter by means of the module-internal bus.

A problem arises, in the case of memory modules fitted with very fast memory chips, for example, DDR DRAMs or QDR DRAMs, that, when writing and reading data, the write data and the read data are respectively related to the clock signals in a temporally different manner.

FIG. 1 illustrates one possible design of a semiconductor memory module, in particular a DIMM module, which is fitted with DRAMs 101–108. The memory module 200 has one or more buffer chips (HUB), of which FIG. 1 illustrates only one buffer chip 110, which receives the data/command/address signals from a memory controller (chip set) (not shown) and then forwards them to the DRAM chips. The process is exactly the reverse when reading data. Synchronization with a clock signal CLK emitted by the buffer chip 110 is necessary for communication between the buffer chip 110 and the DRAM memory chips 101–108 on the memory module 200. As shown, the buffer chip 110 simultaneously routes the clock signal CLK to the right to the DRAM chips 101–104 of the chip row I and to the left to the DRAM chips 105–108 of the chip row II, to be precise as a differential clock signal, and terminates it at the end. The (non-differential) command and address signals C/A which are likewise terminated at their end are routed in the same manner. There are also other approaches to the topology of the lines (which carry the differential clock signal CLK) of the module-internal bus. One of the main problems associated with most approaches is the fact that the data arrive at the individual DRAM chips already over a plurality of clock cycles on account of the relationship between the signal propagation time and the clock speed. In the case of the design illustrated in FIG. 1, in which the data lines and the command and address lines C/A are simply routed parallel toward the outside away from the centrally located buffer chip 110, the signals all arrive at the DRAM chips 101–104, on the one hand, and 105–108, on the other hand, at the same time as the clock signal CLK when writing data (the data, commands and addresses travel to the right from the buffer chip 110 to the DRAM chips 101–104 of the row I and to the left from the buffer chip 110 to the DRAM chips 105–108 of the row II) and the DRAM chips can receive the data in synchronism with said clock signal CLK.

In the case of a read operation, however, only the command and address signals travel in the same direction as the clock signals CLK. The data travel in the opposite direction from the DRAM chips to the buffer chip (HUB) 110. The signal propagation time from the buffer chip 110 to the first DRAM 101 or 105 (and likewise between the individual DRAM chips) is referred to as tD below (tD is, for example, approximately 200 ps). Calculated from the emission of the clock signal, the data need twice the tD in order to arrive at the buffer chip 110 from the first DRAM chip 101 or 105. This time delay results from the clock delay, that is, from the propagation time of the clock signal to the first DRAM chip 101 or 105, and from the data delay time from the DRAM chip 101 or 105 to the buffer chip 110. The period of time tD is respectively added for each memory chip that is further away. The maximum difference can be up to one nanosecond. Previously, it has been assumed that this difference is kept in check by the buffer chip 110. However, this may be relatively difficult since the arrival of the data may be distributed over a plurality of clock cycles. This approach likewise lacks a synchronous signal which can be used to detect the data in the buffer chip 110.

SUMMARY

One embodiment of the present invention avoids the problem outlined above and specifies a semiconductor memory module, the clock topology of which is configured in such a manner that it is possible to both write and read data in synchronism with the clock signal without complicated modification of a buffer chip.

One embodiment of the invention coils the clock signal lines in a loop from the buffer chip to the end of the semiconductor memory module and from there back to the buffer chip, the data being written to the memory chips in synchronism with the clock signal that travels on the semiconductor memory module from the buffer chip toward the outside and the data being read from the memory chips in synchronism with the clock signal that travels back to the buffer chip from the outside left and right. The prerequisite for this is that the memory chips have separate writing and reading clock signal inputs.

According to one embodiment of the invention, the clock signal is thus not only routed to the end of the semiconductor memory module but rather is routed in a loop from there back to the buffer chip again where it is terminated. The writing clock signal pins on the memory chip are supplied on the signal path to the end of the semiconductor memory module and the reading clock signal pins are supplied on the signal path back to the buffer chip. The signal direction during the write operation is thus identical for the clock signal, data, commands and addresses. During the read operation, the command and address signals are likewise transmitted with the writing clock signal but the data are driven by the DLL (Delay Locked Loop) in the memory chip in synchronism with the reading clock signal received at the reading clock signal pins of the memory chips.

In this case, the problem of a different latency of the individual memory chips may arise. In order to solve the latter problem, a flag signal may optionally be transmitted with the clock signal, said signal prescribing to the memory chip that clock cycle at which said memory chip must drive the data during the read operation.

Should the load on the clock signal output of the buffer chip be too high, separate clock signal outputs could be provided on the buffer chip for each row of memory chips. Furthermore, there is the option of using a dedicated amplifier module (for example a PLL module) to amplify the signals at the end of the semiconductor memory module.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other.

Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
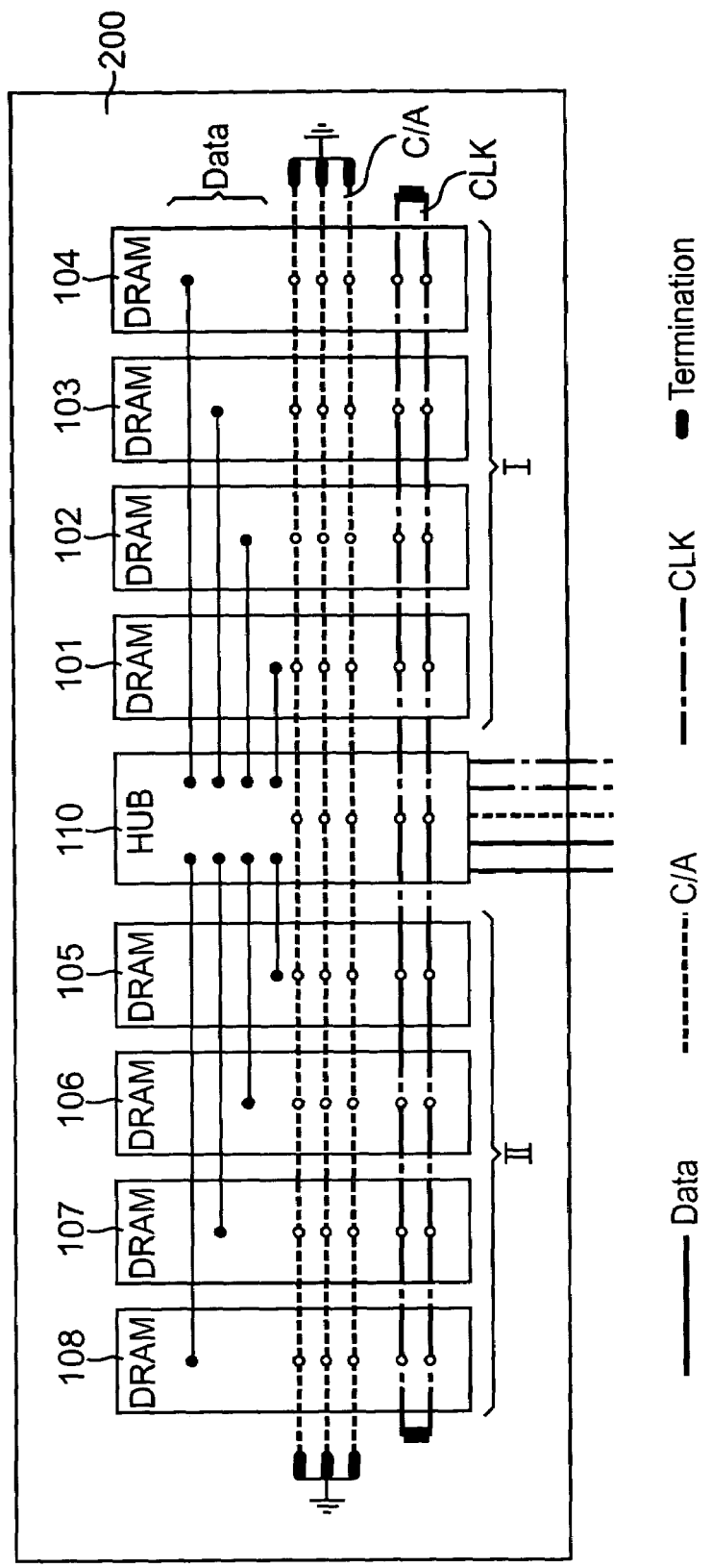
FIG. 1 illustrates a DIMM semiconductor memory module fitted with DRAMs and a HUB.
Figure 2:
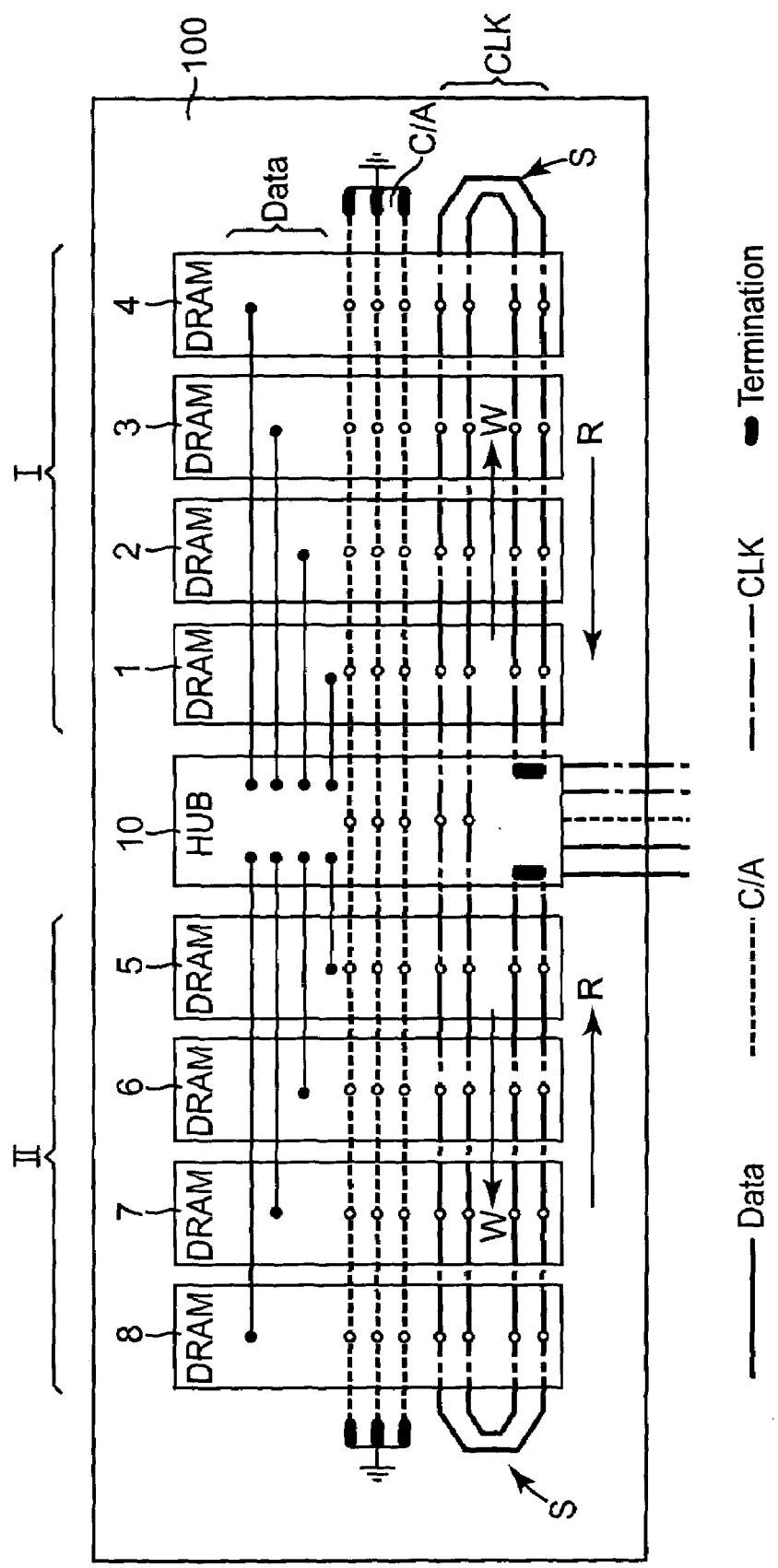
FIG. 2 diagrammatically illustrates a layout view of a semiconductor memory module according to the invention, which is designed, by way of example, as a DIMM memory module and is fitted, by way of example, with a buffer chip and eight memory chips.

A first exemplary embodiment of a semiconductor memory module 100 illustrated in a diagrammatic layout illustration in FIG. 2 has, like the initially described DIMM module illustrated in FIG. 1, a centrally arranged buffer chip (HUB) 10, which drives data signals, command and address signals C/A and clock signals CLK to the right and to the left to DRAM memory chips 1–4 and 5–8 arranged in two rows I and II and also receives the data signals which have been read from the DRAM chips via the data bus. The buffer chip 10 forms an interface toward the outside for the data signals, the command and address signals C/A and the clock signals CLK. According to one embodiment of the invention, the clock signal lines CLK are routed to the right and to the left from the buffer chip 10 to the end of the semiconductor memory module, form a loop S there, and then run back to the buffer chip 10 again where they are terminated. Arrows W and R respectively indicate the writing direction and the reading direction.

The memory chips 1–4 and 5–8 have writing clock and reading clock signal inputs which are respectively separate from one another. When writing data (direction W), the write data are thus written in in synchronism with the clock signal CLK which travels from the buffer chip 10 toward the outside of the semiconductor memory module 100 and is received at the writing clock signal inputs of the memory chips 1–4 and 5–8, whereas, when reading data, the data are read out (direction R) from the memory chips 1–4 and 5–8 in synchronism with the clock signal CLK which is looped back to the buffer chip 10 from the outside via the loop S. Terminating the clock signal lines CLK at the buffer chip 10 ensures that no reflections occur there.

Figure 3:
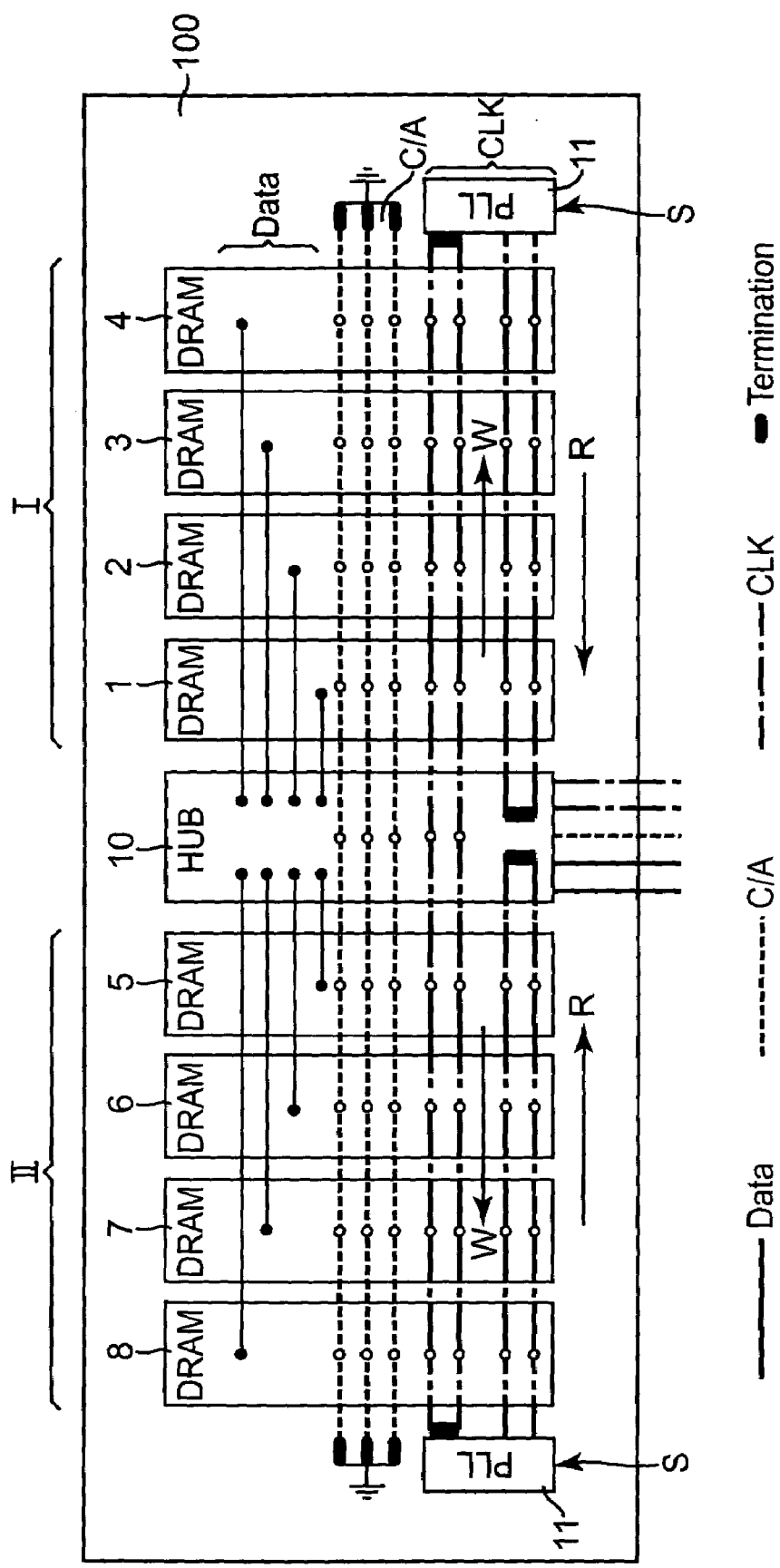
FIG. 3 illustrates a diagrammatic layout of a second exemplary embodiment of a semiconductor memory module according to the invention.

The second exemplary embodiment illustrated in FIG. 3 differs from the above-described exemplary embodiment illustrated in FIG. 2 in that, instead of a simple loop formation S at the end of the semiconductor memory module, the clock signal CLK is amplified there by means of an amplifier chip 11, which is, for example, a PLL module, and is then led back (arrow R) to the buffer chip 10. The PLL module 11 accordingly completes the loop S for the clock signal CLK.

Figure 4:
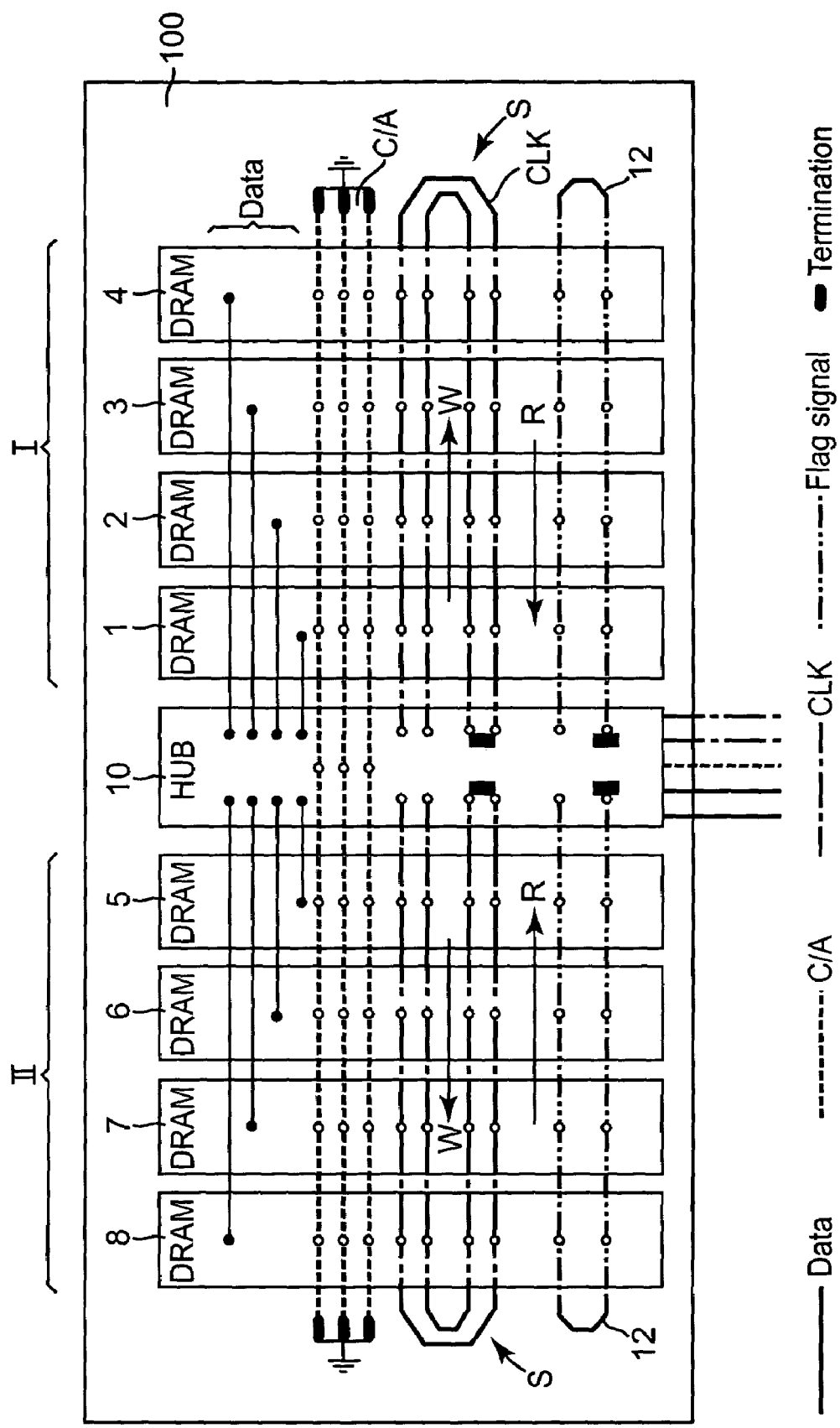
FIG. 4 illustrates a diagrammatic layout of a third exemplary embodiment of a semiconductor memory module according to the invention, which also illustrates a variant thereof, said variant transmitting a flag signal in addition to the clock signal.

Should the load on the clock signal output of the buffer chip 10 be too high, the buffer chip 10 may have separate clock signal outputs for the row I of memory chips 1–4 located to the right of it and the row II of memory chips 5–8 located to the left of the buffer chip 10. FIG. 4 illustrates an exemplary embodiment of this type. In addition, the clock signal lines CLK of the exemplary embodiment illustrated in FIG. 4 may also have an amplifier module 11 (as illustrated in FIG. 3) at the end of the semiconductor memory module 100.

It was already mentioned above that the different latency of the individual memory chips may constitute a problem. Therefore, in the exemplary embodiment of FIG. 4, in addition to the clock signal CLK, a flag signal 12 is looped in the same manner, via the individual memory chips of the rows I and II, from the buffer chip 10 to the end of the semiconductor memory module 100 and from there back to the buffer chip 10 where it is then terminated. In one variant (not illustrated), a flag signal could also be transmitted with the read command, said flag signal then traveling to the right and to the left from the buffer chip 10 only.

The invention was described, by way of example, for a DIMM module having eight DRAM chips and one buffer chip. However, it goes without saying that the principle underlying the invention is not restricted to DIMM modules having DRAM memories but rather may be used wherever data are written to, and read from, memory chips in synchronism with a very fast clock signal. A semiconductor memory module of this type may also be fitted, for example, with QDR DRAMs. Sixteen memory chips instead of eight memory chips may be arranged on the semiconductor memory module. Instead of one buffer chip (HUB), it is also possible to use two buffer chips, each of which is assigned to eight memory chips, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory module comprising:

a plurality of memory chips;

a module-internal clock, address, command and data signal bus;

at least one buffer chip that drives clock signals and command and address signals to the memory chips and also drives data signals to, and receives them from, the memory chips via the module-internal clock, address, command and data signal bus; and an interface to an external memory main bus formed by the buffer chip;

wherein the memory chips are arranged in at least one row starting from the buffer chip, and are connected to the latter by means of the module-internal bus;

wherein the memory chips respectively have separate writing and reading clock signal inputs for receiving the clock signals;

wherein the clock signal lines are routed in at least one loop, via the memory chips, from the buffer chip to the end of each row and from there back to the buffer chip; and wherein the memory chips are clocked, when writing data, by the clock signals, which originate from the buffer chip and are received at the writing clock signal inputs of said memory chips and are clocked, when reading data, by the clock signals, which travel back to the buffer chip and are received at the reading clock signal inputs of the memory chips.

2. The semiconductor memory module of claim 1, wherein, starting from a buffer chip arranged centrally on the semiconductor memory module, a respective memory chip row is arranged on the right and on the left and a respective clock signal loop is routed, via each memory chip row, from the buffer chip to the right-hand and left-hand ends of the semiconductor memory module and back to the buffer chip.

3. The semiconductor memory module of claim 1, wherein said module is a DIMM memory module and the memory chips are DDR DRAM chips.

4. The semiconductor memory module of claim 1, wherein the clock signals are routed as differential clock signals via two clock signal lines.

5. The semiconductor memory module of claim 1, wherein the clock signal lines are terminated at their incoming ends on the buffer chip.

6. The semiconductor memory module of claim 1, wherein a respective clock signal amplifier is arranged in the clock signal lines at the end of each memory chip row, said amplifier amplifying the writing clock signal there, which arrives from the buffer chip, and routing it back, in amplified form, to the buffer chip as a reading clock signal.

7. The semiconductor memory module of claim 6, wherein the clock signal amplifier is a PLL module.

8. The semiconductor memory module of claim 1, wherein the buffer chip has separately driven clock signal outputs for each memory chip row.

9. The semiconductor memory module of claim 1, wherein the buffer chip generates a flag signal in addition to the clock signal, said flag signal being fed to a flag signal input of the memory chips and likewise being routed in a loop from the buffer chip to the end of each memory chip row and back to the buffer chip.

10. The semiconductor memory module of claim 9, wherein the frequency of the flag signal is a fraction of the frequency of the clock signal.

11. A semiconductor memory module comprising:

a plurality of memory chips each having separate writing and reading clock signals inputs for receiving clock signals, the memory chips arranged in at least one row;

a module-internal clock, address, command and data signal bus;

an external memory main bus; and at least one buffer chip that drives clock signals and command and address signals to the memory chips, that drives data signals to, and receives data signals from, the memory chips via the module-internal bus, and that forms an interface to the external memory bus;

wherein the memory chips are coupled to the buffer chip via the module-internal bus;

wherein the clock signal lines are routed in at least one loop, via the memory chips, from the buffer chip to the end of the row and from there back to the buffer chip; and wherein the memory chips are clocked, when writing data, by the clock signals, which originate from the buffer chip and are received at the writing clock signal inputs of the memory chips and are clocked, when reading data, by the clock signals, which travel back to the buffer chip and are received at the reading clock signal inputs of the memory chips.

12. The semiconductor memory module of claim 11, wherein, starting from a buffer chip arranged centrally on the semiconductor memory module, a respective memory chip row is arranged on the right and on the left and a respective clock signal loop is routed, via each memory chip row, from the buffer chip to the right-hand and left-hand ends of the semiconductor memory module and back to the buffer chip.

13. The semiconductor memory module of claim 11, wherein said module is a DIMM memory module and the memory chips are DDR DRAM chips.

14. The semiconductor memory module of claim 11, wherein the clock signals are routed as differential clock signals via two clock signal lines.

15. The semiconductor memory module of claim 11, wherein the clock signal lines are terminated at their incoming ends on the buffer chip.

16. The semiconductor memory module of claim 11, wherein a respective clock signal amplifier is arranged in the clock signal lines at the end of each memory chip row, said amplifier amplifying the writing clock signal there, which arrives from the buffer chip, and routing it back, in amplified form, to the buffer chip as a reading clock signal.

17. The semiconductor memory module of claim 16, wherein the clock signal amplifier is a PLL module.

18. The semiconductor memory module of claim 11, wherein the buffer chip has separately driven clock signal outputs for each memory chip row.

19. The semiconductor memory module of claim 11, wherein the buffer chip generates a flag signal in addition to the clock signal, said flag signal being fed to a flag signal input of the memory chips and likewise being routed in a loop from the buffer chip to the end of each memory chip row and back to the buffer chip.

20. The semiconductor memory module of claim 19, wherein the frequency of the flag signal is a fraction of the frequency of the clock signal.

* * * * *